United States Patent
Rozman et al.

(10) Patent No.: US 10,949,119 B2
(45) Date of Patent: Mar. 16, 2021

(54) DATA SHAPING TO REDUCE ERROR RATES IN SOLID STATE MEMORY DEVICES

(71) Applicant: Western Digital Technologies, Inc., San Jose, CA (US)

(72) Inventors: David Rozman, Kiryat-Malakhi (IL); Stella Achtenberg, Netanya (IL); Arthur Shulkin, Yavne (IL)

(73) Assignee: Western Digital Technologies, Inc., San Jose, CA (US)

( * ) Notice: Subject to any disclaimer, the term of this patent is extended or adjusted under 35 U.S.C. 154(b) by 242 days.

(21) Appl. No.: 15/900,531

(22) Filed: Feb. 20, 2018

(65) Prior Publication Data

US 2019/0258423 A1 Aug. 22, 2019

(51) Int. Cl.
| | |
|---|---|
| *G06F 3/06* | (2006.01) |
| *G11C 16/26* | (2006.01) |
| *G11C 16/10* | (2006.01) |
| *G06F 11/07* | (2006.01) |
| *G11C 7/10* | (2006.01) |
| *G11C 16/34* | (2006.01) |
| *G11C 11/56* | (2006.01) |
| *G11C 16/04* | (2006.01) |

(52) U.S. Cl.
CPC .......... *G06F 3/0659* (2013.01); *G06F 3/0619* (2013.01); *G06F 3/0679* (2013.01); *G06F 11/076* (2013.01); *G06F 11/0727* (2013.01); *G11C 7/1006* (2013.01); *G11C 16/10* (2013.01); *G11C 16/26* (2013.01); *G11C 16/3495* (2013.01); *G11C 11/5628* (2013.01); *G11C 11/5642* (2013.01); *G11C 11/5671* (2013.01); *G11C 16/0483* (2013.01)

(58) Field of Classification Search
CPC ... G11C 16/3495; G11C 7/1006; G11C 16/10; G11C 16/26; G11C 11/5671; G11C 11/5642; G11C 16/0483; G11C 11/5628; G06F 3/0659; G06F 3/0619; G06F 3/0679; G06F 11/076; G06F 11/0727
See application file for complete search history.

(56) References Cited

U.S. PATENT DOCUMENTS

| | | | |
|---|---|---|---|
| 7,925,936 B1 * | 4/2011 | Sommer | G11C 11/5628 714/704 |
| 2011/0055461 A1 * | 3/2011 | Steiner | G06F 11/1072 711/103 |

(Continued)

*Primary Examiner* — Khamdan N. Alrobaie
(74) *Attorney, Agent, or Firm* — Brinks Gilson & Lione

(57) ABSTRACT

Systems and methods are described for reducing error rates on data storage devices by applying data shaping to data written to such devices in order to avoid error-prone states on cells within the devices. Different states of individual cells (such as those representing different bit patterns) may have different propensities for error, and these propensities may vary during operation of a device. Thus, a device as disclosed herein may determine error-prone states for a cell or group of cells, and apply data shaping to data written to such cells to reduce the likelihood that writing the data places the cell or cells into an error-prone state. Data shaping may be used, for example, to increase the occurrence of "0" bits within input data, thus avoiding error-prone low voltage states that may be used to represent a series of "1" bits.

24 Claims, 5 Drawing Sheets

(56) References Cited

U.S. PATENT DOCUMENTS

| | | | |
|---|---|---|---|
| 2013/0191579 A1* | 7/2013 | Sharon | G11C 11/5628 711/103 |
| 2014/0003152 A1* | 1/2014 | Sharon | G11C 11/5628 365/185.18 |
| 2014/0157086 A1* | 6/2014 | Sharon | G06F 11/1012 714/773 |
| 2014/0355347 A1* | 12/2014 | Shur | G11C 16/16 365/185.11 |
| 2015/0058536 A1* | 2/2015 | Seol | G11C 11/5621 711/103 |
| 2015/0324148 A1* | 11/2015 | Achtenberg | G06F 11/1012 711/103 |
| 2019/0115078 A1* | 4/2019 | Kim | G11C 16/3445 |
| 2019/0258423 A1* | 8/2019 | Rozman | G06F 11/0727 |

* cited by examiner

DATA SHAPING TO REDUCE ERROR RATES IN SOLID STATE MEMORY DEVICES

BACKGROUND

Non-volatile memory, such as flash memory, have been widely adopted for use in consumer products. Flash memory may be found in different forms, for example in the form of a portable memory card that can be carried between host devices or as a solid state disk (SSD) embedded in a host device. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by comparing the cell read out voltage to one or more read voltage thresholds. Preferably, these thresholds distinctly divide the states of the cell, and writing data into the cell results in a cell read out voltage between these distinct read voltage thresholds. However, defects in cells (either introduced during production or over use of the device) can cause the distributions of cell read out voltages within cells to shift or expand, such that it may not be possible to establish a read voltage threshold to distinctly differentiate a cell's state based on read out voltage. Thus, errors are introduced into the data written to the cell. When these errors occur frequently enough to overwhelm the error correction available to a device, these cells can become unusable.

BRIEF DESCRIPTION OF THE DRAWINGS

Systems and methods that embody the various features of the invention will now be described with reference to the following drawings, in which.

DETAILED DESCRIPTION

Figure 1:
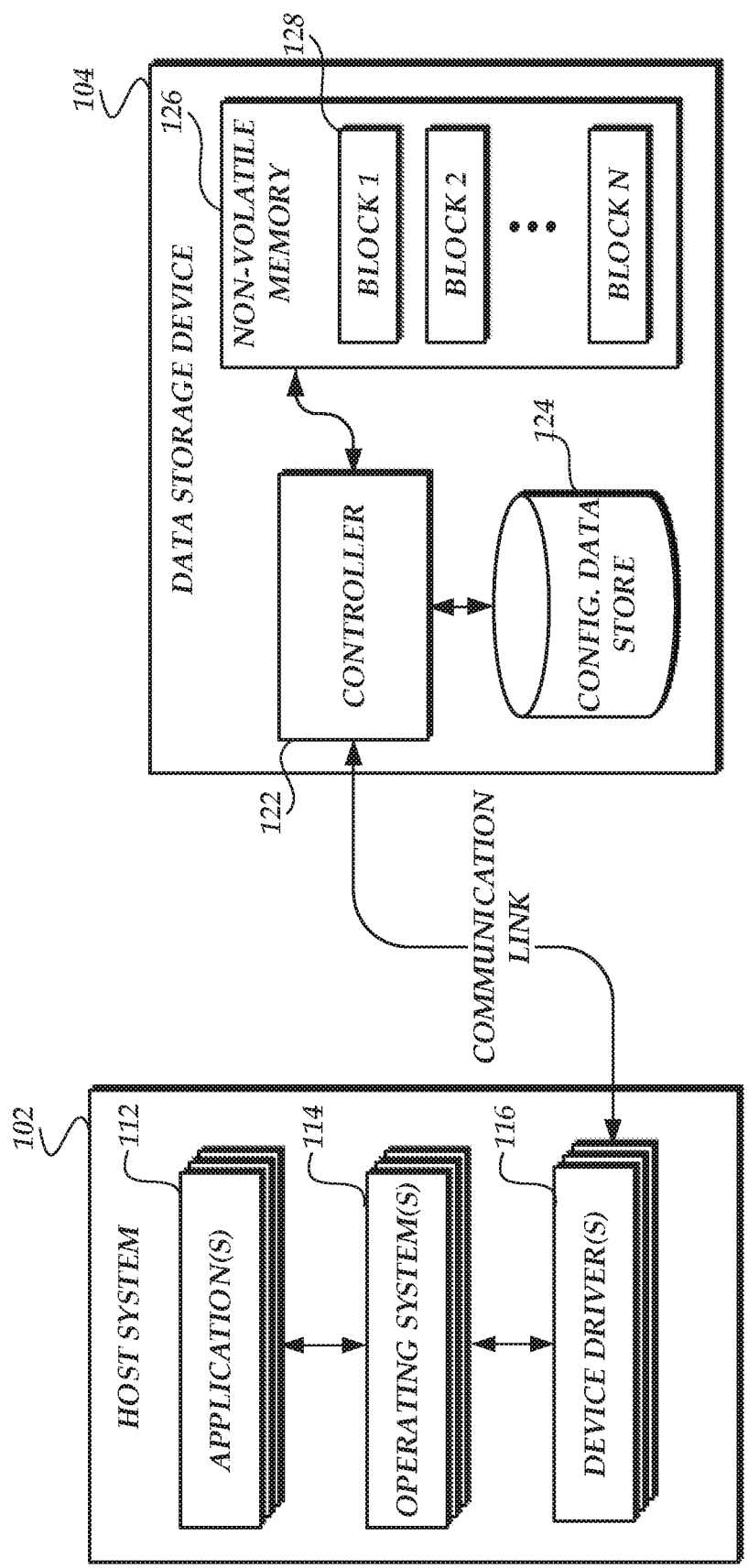
FIG. 1 is a block diagram illustrating a combination of a host system and a data storage device according to some embodiments of the present disclosure.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Generally, some embodiments of systems and methods described herein improve the performance of a flash memory device by providing efficient, accurate algorithms and processes for shaping data stored within blocks of the device based on detected or expected read voltage distributions of the blocks, mitigating or reducing errors when reading the blocks due to non-optimal read voltage distributions. Generally described, read voltage distributions reflect the distribution of voltages of a memory cell or group of memory cells (e.g., data blocks or wordlines) when in a variety of different states (e.g., each state representing one or more bits written to the cell or group of cells). Preferably, the voltage range of each state is distinct, such that reading a voltage within a range corresponding to a state indicates that the cell or cell group has been written to that state. However, in practice, voltage ranges for two or more states may overlap, such that when data is read from a cell or cell group it is unclear what state the cell was intended to be in, resulting in read errors. If the amount of read errors exceeds a device's ability to correct errors, the cell or group of cells may be marked as "bad" and rendered unusable, reducing both the capacity and life expectancy of the device. In some instances, bad cells or cell groups are caused by imperfections during device manufacture. Groups of such cells are sometimes referred to as "bad blocks." In other instances, bad cells or cell groups occur during the lifetime of the device. For example, exposing a cell or cell group to repeated program/erase cycles may cause a voltage range for a state to shift, particularly in states near the low or high end of the total voltage range of a cell or cell group. Similarly, to defects caused during Groups of such cells are sometimes referred to as "grown bad blocks." While it may be possible to simply avoid use of bad blocks or grown bad blocks, this reduces the total capacity of the drive and can eventually lead to drive failure (e.g., when a number of usable blocks drops below a threshold level). Thus, embodiments of the present disclosure enable a device to minimize errors in a cell or group of cells with non-optimal (e.g., overlapping) voltage ranges, enabling such cells to continue to be used while reducing error rates occurring due to such use. Specifically, embodiments of the present disclosure enable a device to selectively apply data shaping techniques to data written within cells or groups of cells with non-optimal voltage ranges, such that data is less likely to be written to states with overlapping voltage ranges, reducing error rates when reading such cells or groups of cells. This selective application of data shaping techniques can thus expand the lifespan of a device while reducing errors during operation.

Illustratively, a given device may include 3-bits per cell multiple-level cell (MLC) memory. By varying the voltage stored in each cell, the cell may be placed into one of eight ($2^3$) states, representing a defined bit pattern (e.g., "111" at a lowest voltage, "011" at a next lowest voltage, etc.). Due to physical limitations of such memory, placing a cell within a given state may not always result in an exact voltage, but may result instead in a range of voltages for each state. An optimal distribution of voltages for a cell may occur when the voltage range of each of the eight possible states is distinct. However, in practice, the voltage ranges of two or more states may overlap. This tendency may increase as the number of possible states of a cell increases. Thus, for example, 3-bits per cell MLC may have a higher tendency for voltage range overlap between states than 2-bits per cell MLC, which may have a higher tendency for such overlap than single-level cell (SLC). One common occurrence with 3-bits per cell MLC memory is an increase in the voltage range for a lowest voltage (e.g., "erase") state, which by convention is often seen to represent the "111" bit pattern. A device experience such an occurrence may therefore be unable in some instances to determine from a read voltage whether a cell is in an erase state or in a next-lowest-voltage state (e.g., the "011" state). This may inhibit storing either the "111" or "011" bit pattern within the cell, as storing either pattern may result in a read error of the device (e.g., a cell written with the "011" bit pattern may be read as the "111" bit pattern). However, the voltage range of other states (such as those corresponding to higher voltages) may not be affected by the shift of low-voltage range states. Thus, placing the cell into other, higher voltage, states (e.g., "000") may be unlikely to cause read errors.

In a typical data set of sufficient size (e.g., on the order of megabytes), the distribution of states among cells of a device can be expected to be normal (e.g. uniformly distributed). Thus, in the example above related to 3-bits per cell multiple-level cell memory, a cell may be equally likely to be programmed at lower states, like the 111 or 011 states, as to upper states, like a 000 state. However, where error rates of a cell vary depending on state (as in the example above), it may be desirable to increase the proportion of data written to non-error-prone states and decrease the proportion of data to error-prone states. Such a change in configuration of the device may reduce error rates on the cell. In some instances, this reduction in error rates may cause an otherwise unusable cell once again useable (e.g., due to transforming a uniform state distribution to a non-uniform state distribution).

In accordance with embodiments of the present disclosure, the distribution of data among states of a cell within a device may be modified by applying data shaping to the data prior to writing to the cell. The specific data shaping may be selected to reduce a probability that data will be written to error-prone states of the cell and to increase the probability that data will be written to other, non-error prone states. A variety of mechanisms for shaping data to effect distribution among states of solid state devices are known in the art. For example, mechanisms for shaping data are disclosed within:

U.S. Pat. No. 8,756,365 to Sharon et al., entitled "Apparatus and method for enhancing flash endurance by encoding data" and issued Jun. 17, 2014 (the "'365 Patent");

U.S. Pat. No. 8,799,559 to Sharon et al., entitled "Endurance enhancement coding of compressible data in flash memories" and issued Aug. 5, 2014 (the "'559 Patent");

U.S. Pat. No. 9,165,649 to Sharon et al., entitled "Endurance enhancement coding of compressible data in flash memories" and issued Oct. 20, 2015 (the "'649 Patent"); and U.S. Pat. No. 10,275,186 to Sharon et al., entitled "System and Method of Data Compression" and issued Apr. 30, 2019 (the "'186 Patent")

each of which is hereby incorporated by reference in its entirety. The '365 Patent, '559 Patent, '649 Patent, and 186 Patent are collectively referred to herein as "the Data Shaping References." As will be described below, mechanisms of the Data Shaping References may be applied, in accordance with the present disclosure, to shape data such that a probability of data being written to an error-prone state is reduced, thereby increasing overall operating efficiency and longevity of a device while reducing error rates.

While illustrative examples are described herein with respect to specific groupings of memory cells (e.g., data blocks or wordlines), embodiments may function with respect to any number of different groupings, or with respect to individual memory cells. For example, embodiments of the present disclosure may apply data shaping to reduce error rates at a per die level, or across multiple memory dies. Embodiments of the present disclosure may further apply data shaping to reduce error rates to specific blocks of memory (e.g., based on the location of block), or for any other characteristic of a memory cell or collection of cells. Thus, the examples provided herein are intended to be illustrative in nature.

The above will be more fully appreciated and understood with reference to the following description.

System Overview

FIG. 1 illustrates one example configuration of a host system 102 and data storage device (or memory device) 104 in accordance with some embodiments of the present disclosure. As shown in FIG. 1, the host system 102 generally includes one or more logical applications 112, operating systems 114, and device drivers 116. Such applications 112, operating systems 114, and device drivers 116 can represent logical software modules executed by underlying hardware components of the host system 102 (not shown within FIG. 1). Hardware components of the host system 102 may include, for example, one or more physical processors, application-specific integrated circuits (ASICs), field programmable gate arrays (FPGAs), communication busses, volatile or non-volatile storage media, input devices, or output devices. Components of the host system 102 which enable logical applications 112, operating systems 114, and device drivers 116 are well known to those skilled in the art, and therefore will not be described in more detail herein.

The applications 112 and operating systems 114 may provide various functionalities to users of the host system 110 which require or are assisted by storage of data within the data storage device 104. Accordingly, the host system may include one or more device drivers 116 configured to enable transmission of data storage commands (e.g., read or write commands) to the data storage device 104. Such commands may be transmitted via a communication link between the host system 102 and the data storage device 104. In one embodiment, the communication link may include a storage bus, such as a serial ATA (SATA) storage bus or other storage bus utilizing the advanced host controller interface (AHCI) standard. In another embodiment, the communication link may include a system bus, such as a Peripheral Component Interconnect (PCI) or PCI Express bus. In still other embodiments, the communication link may include network communication links (e.g., Ethernet links enabling communication via transmission control protocol (TCP)/internet protocol (IP) standards), a universal serial bus (USB) link, or any of a variety of known data storage communication links.

The data storage device 104 includes the non-volatile memory 126 coupled to a controller 122. The controller 122 may enable the host system 102 to write to and read from the non-volatile memory 126, and perform other functionalities related to maintenance or operation of the data storage device 104, some of which are described below. The controller 122 may thus include a processor and memory configured to implement these functionalities. Data related to a configuration of the controller 122 may be stored in configuration data store 124, which may correspond illustratively to random access memory (RAM), read only memory (ROM), or a combination thereof. This data may include, for example, operating parameter sets that designate, for example, how the controller 122 operates to write data to or read data from the non-volatile memory 126. Operating parameter sets may include, for example, read voltage thresholds used to read information written within the non-volatile memory 126. In accordance with some embodiments of the present disclosure, the configuration data store 124 may further include data shaping parameters, denoting data shaping to be applied to one or more blocks 128 of the non-volatile memory 126. As detailed below, such data shaping may be used, for example, to reduce the probability that data written to a block results in an error-prone block state.

In one instance, the non-volatile memory 126 is a NAND flash memory. The NAND flash memory may include, for example, single-level cell (SLC) memory, multiple-level cell (MLC) memory, or a combination thereof. MLC memory may include 2-bits per cell memory, 3-bits per cell memory (known in some instances as "triple level cell," or TLC, memory), 4-bits per cell memory known in some instances as "quad level cell," or QLC, memory), etc. Cells within the non-volatile memory 126 can be organized into physical or logical groups. In the illustrative example of FIG. 1, the cells are organized into a plurality of blocks 128 (depicted in FIG. 1 as blocks 1 through n). One potential configuration of a block 128 is described below with respect to FIG. 2.

Operation of non-volatile memory 126, such as NAND memory, is known in the art and thus will not be described in detail herein. However, for the purposes of description of embodiments of the present disclosure, one skilled in the art will appreciate that non-volatile memory 126 has measurable characteristics that vary among blocks 128 (e.g., due to variances in manufacturing of the non-volatile memory 126). For example, because memory cells store information in the form of varying levels of voltage, each block 128 can be associated with one or more voltage thresholds that distinguish different information stored by the cell. For example, a stored voltage of between 0.375 and 1.125 volt may indicate a first value (e.g., the bit string "110"), a stored voltage of between 1.125 and 1.875 volts may indicate a second value (e.g., the bit string 100), etc. To distinguish between stored values, a storage device 104 may establish one or more read thresholds for a block 128, such that if the stored voltage at the block 128 is below a first threshold, it is determined to store a first value, if the stored voltage at the block 128 is above the first threshold and below a second threshold, it is determined to store a second value, etc. The number of read thresholds established for a cell generally varies with the number of bits storable by the cell. For example, SLC memory generally establishes a single read threshold value, while 2-bit MLC establishes 3 read threshold values, 3-bit MLC establishes 7 read threshold values, 4-bit MLC establishes 15 read threshold values, etc. The controller 122 can be configured to determine optimal read threshold values according to a predetermined algorithm. Various such algorithms for determining optimal read threshold values are known in the art. One example of such an algorithm is described within U.S. Patent Publication No. 2014/0355340 to Sharon et al., entitled "Updating Read Voltages" (the "'340 Publication") which is hereby incorporated by reference in its entirety. In one embodiment, read thresholds can be are determined to divide voltage ranges associated with each state (e.g., based on attempting to place a cell within the state and reading back a resulting voltage). Preferentially, these voltage ranges distinctly divide the various states. However, in practice, voltage ranges for different states may overlap. The frequency of such overlaps can in some instances increase with wear on the device 104.

One skilled in the art will appreciate that blocks 128 may be associated with other characteristics including, for example, times required for the controller 122 to successfully write to a block, a time required to erase a block 128, a number of failed bits detected at a block 128 (e.g., instances in which the controller 122 attempted to write a bit value to a block 128 but after which the controller 122 failed to read that bit value from the block 128), a bit error rate (BER) of a block 128, or a number of programming loops required to set a block 128 to a desired value (e.g., successive applications of voltage to the block 128 to cause the block 128 to maintain a desired voltage level). In accordance with general operation of NAND devices, these characteristics may vary across blocks 128 of non-volatile memory, across wordlines within blocks 128, or across other groupings of memory cells.

As noted above, the occurrence of voltage range overlaps within cells of a block 128 may increase the error rate when attempting to write to and read data from the block 128. Generally described, the cells of a block 128 that are written to an error-prone state (e.g., one whose voltage range overlaps with another state), the higher the frequency of errors. Thus, it may be desirable to decrease the frequency with which cells of a block 128 are programmed into an error-prone state. Because each state can correspond to a specific bit pattern (e.g., '111'), reducing a frequency of this bit pattern within data written to the block 128 can be expected to reduce the number of cells of the block 128 programmed into the error-prone state, thus improving performance of the block 128. In some instances, this may enable the device 104 to continue to use blocks 128 that otherwise would be unused (e.g., marked as unusable by the controller 122).

Thus, in accordance with embodiments of the present disclosure, the controller 122 can be configured to detect blocks 128 with cells that have voltage distributions indicating error-prone states, and to shape data to be written to the cells in order to reduce a likelihood that cells will be programmed to these error-prone states. More specifically, the controller 122 may be configured to determine a bit pattern associated with the error-prone state, and to apply a data shaping algorithm to a set of input data (e.g., data to be written to the device 104) to reduce the likelihood of occurrence of the determined bit pattern. Data shaping algorithms for reducing the likelihood or frequency of bit patterns within a set of input data are disclosed, for example, in the Data Shaping References incorporated by reference above. The algorithms may be particularly suited for reducing the frequency of a specific bit value within input data (e.g., by shifting data to include more 1s or more 0s, as may be desired). Beneficially, error-prone bit states within a device 104 often correspond to specific bit frequencies. For example, blocks 128 often exhibit overlapping voltage ranges at either a low voltage range (e.g., an overlap between a lowest voltage state and a next lowest voltage state), commonly used to represent data including a high frequency of 1s, or a high voltage range (e.g., an overlap between a highest voltage state and a next highest voltage state), commonly used to represent data including a high frequency of 0s. Thus, by application of a data shaping algorithm to shift specific bit frequencies of an input data stream, the controller 122 can reduce the likelihood that cells of a block 128 will be programmed into an error-prone state.

In one embodiment, the controller 122 may be configured to detect error-prone states via interaction with the memory 126. For example, the controller 122 may conduct test read/writes of blocks 128 (e.g., periodically or on detection of a high error rate) in order to determine whether the block 128 includes cells with error-prone states. In other instances, the controller 122 may be configured to detect error-prone states via other characteristics of the memory 126. Illustratively, the controller 122 may be programmed to assume a block 128 with specific characteristics is likely to exhibit a particular error-prone state. These characteristics may be determined, for example, by application of a machine learning algorithm to characteristics of blocks 128 across multiple devices 104. Thereafter, the controller 122 may apply a data shaping algorithm appropriate to the assumed error-prone state to data written into the block 128, and monitor whether the error rate of the block 128 is reduced as compared to data written without use of a data shaping algorithm. Thus, in some embodiments, the controller 122 is not required to itself determine which states of cells of a block 128 exhibit a tendency toward error.

Illustrative algorithms and interactions for applying data shaping algorithms in order to reduce errors reading data from blocks 128 are described in more detail below.

Illustrative Block Configuration

Figure 2:
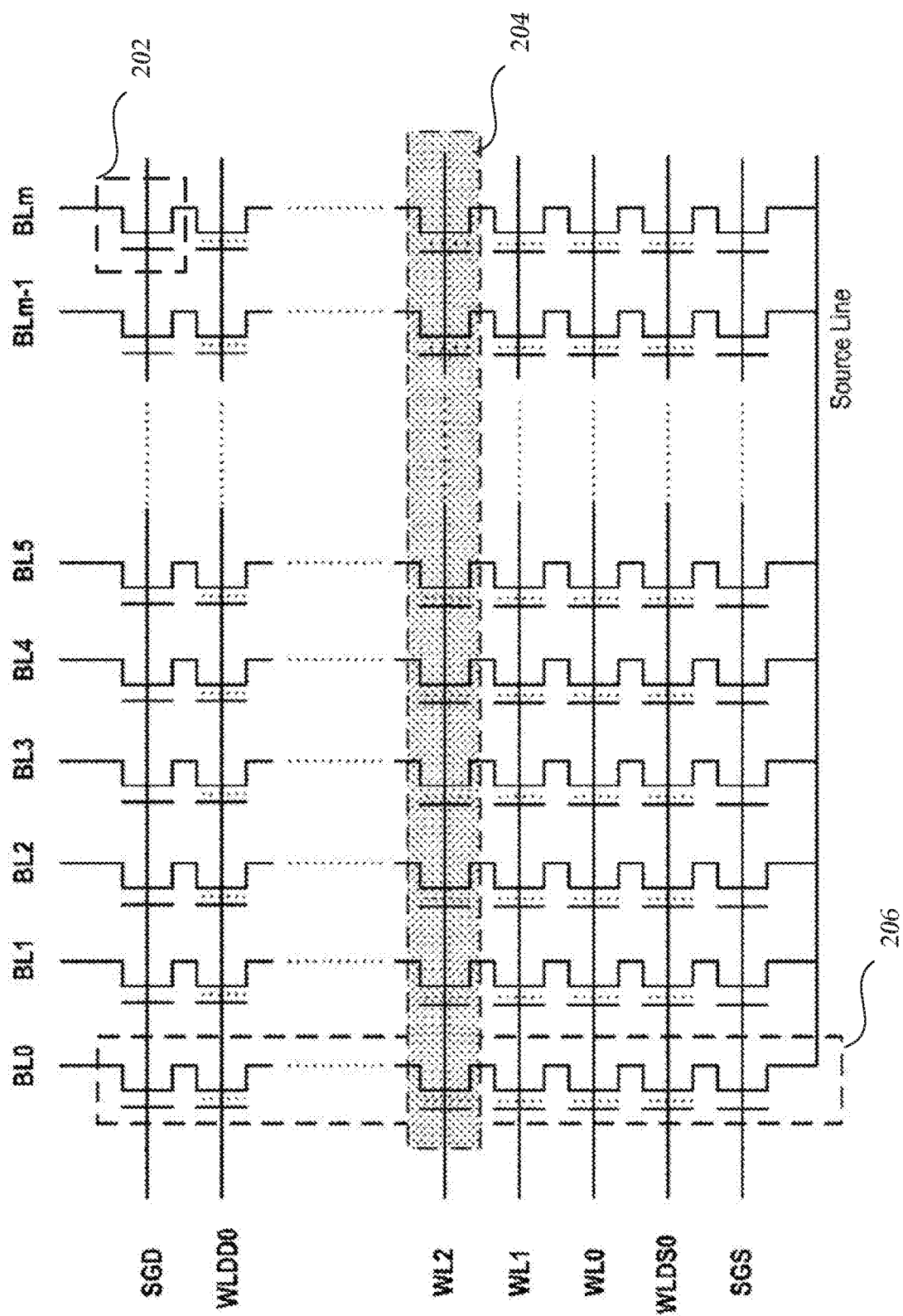
FIG. 2 is an illustrative visualization of a data block within a data storage device of FIG. 1.

One illustrative example of a configuration of a block 128 within non-volatile memory 126 is shown in FIG. 2. As shown in FIG. 2, the block 128 may include a number of memory cells 202 arranged within a grid. Rows of the grid can represent a wordline 204 within the block 128, which may be read from or programmed in parallel. While a block 128 may include any number of wordlines 204, an illustrative number of wordlines 204 is shown in FIG. 2. Columns of the grid can represent bitlines 206. A device 104 may apply appropriate voltages to various bitlines 206 and wordlines 204 in order to read voltages stored within cells 202 of a particular wordline 204. The voltage read from a given cell 202 can represent a state of the cell, and a corresponding number of logical bits represented by the cell. Various possible states for the cell are generally represented by read voltage thresholds, each of which corresponds to a given state. For example, a voltage between a first read voltage thresholds and a second read voltage threshold may represent a first state, a voltage between a second read voltage thresholds and a third read voltage threshold may represent a second state, etc. However, due to physical constraints of cells 202, it may not be practical or possible set an exact voltage level on a cell 202. Thus, a controller 122 can be configured to determine a range of voltages that result from attempting to block a cell 202 within a specific state. The controller 122 may thereafter determine optimal read voltage thresholds for as cell 202, that enable the cell to be read from with minimal error rates. In some instances, the optimal read voltage thresholds may vary depending on a location of a cell 202 within a block 128. For example, the voltage range of a state (and therefore a set of read voltage thresholds for the state) may tend to vary (e.g., increase or decrease) between a block 128 or between wordlines 204 within the block 128. Moreover, these ranges may shift during operation of the block.

Illustrative Voltage Distributions

Figure 3:
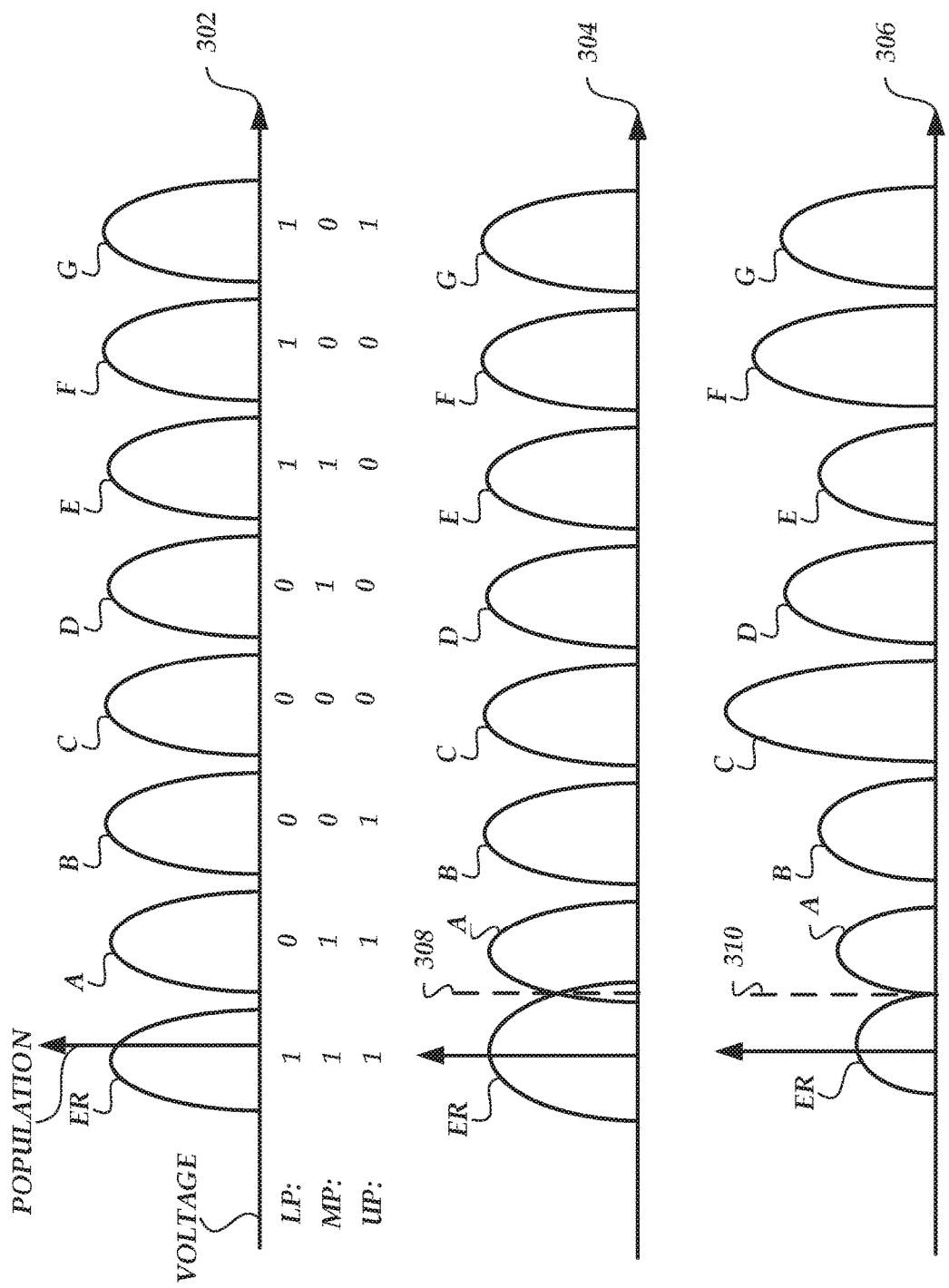
FIG. 3 is an illustrative visualization of voltage distributions within a data block of a data storage device of FIG. 1.

Illustrative visualizations or graphical depictions of voltage range distributions for a block 128 of a device 104 are shown in FIG. 3. Specifically, FIG. 3 depicts a first distribution 302 of a block 128 with distinct voltage ranges for each potential state and a uniform distribution of cells programmed within each state, a second distribution 304 of a block 128 with two states of overlapping voltage ranges (thus rendering such states error-prone) and a uniform distribution of cells programmed within each state, and a third distribution 306 of a block 128 with two states of overlapping voltage ranges (thus rendering such states error-prone) and a non-uniform distribution of cells programmed within each state, the non-uniform distribution resulting from application of data shaping during writing of data to the block 128.

Generally described, each distribution 302 reflects a number of states ("ER," corresponding to an erase state, and "A"-"G," correspond to various written states) in which a cell of a block 128 can be programmed. As noted above, each state may correspond to a specific bit pattern, as shown under the distribution 302 (these bit patterns are not reproduced with respect to distributions 304 and 306, but should be understood to apply also to those distributions 304, 306). Bits of each bit patterns are commonly referred to based on relative position, with the first bit being the lower page ("LP"), the second bit being the middle page ("MP"), and the third bit being the upper page ("UP"). The number of bit pages and states may vary according to the type of memory. For example, SLC memory generally includes only a single bit page and two possible states.

Within each distribution 302-306, the X axis illustratively represents a voltage of a memory cell. The specific voltages may vary according to the specific memory, and thus exact voltages are not depicted in FIG. 3. However, it should be understood that the voltages of the distributions 302-306 can generally increase from zero (at a point where the X and Y axes intersect). The Y axis illustratively represents a number of cells within the block 128 programmed with a given voltage. Thus, the curve attributed to each state can represent a distribution of voltages for cells within a block written with the state. In one embodiment, this curve represents statistically determined likelihoods, rather than actual states of cells. For example, the distribution 302 may represent a statistically likelihood of distribution of cells of a block after those cells are written with data that is represented by a uniform distribution of cell states (e.g., as may be expected to be the case with a sufficiently large data set, such a set that fills the block 128).

As can be seen in distribution 302, the curves of each state in the distribution 302 are distinct. Thus, a controller 122 of the block 128 may establish read thresholds corresponding to the division between each state curve, making it may statistically unlikely that writing, for example, the "011" bit pattern (corresponding to state A) to a block 128 represented by distribution 302 would result in an error when attempting to read that bit pattern from the block 128. It may therefore be desirable to attempt to maintain an even proportion of data in each state, as represented by the unvarying height of the curves of each state.

In contrast to the distribution 302, the distribution 304 illustrates state curves in an instance where the voltage range of two curves at least partially overlap. Specifically, in distribution 304, the voltage range of the "ER" state has shifted higher. Thus, for example, attempting to erase a cell of the block 128 represented by the distribution 304 may be somewhat likely to result in a voltage toward the higher end of the voltage range from the "ER" state, which voltage is also encompassed within the "A" state. One example of such a voltage is shown at line 308. Thus, attempting to program a cell of the block 128 into either the "A" state or the "ER" state may result in the cell having the voltage of line 308, increasing the likelihood of read errors on the block 128.

A solution to this problem is provided by applying data shaping to data written to the block 128, such that the likelihood of writing data to the error-prone states (here, states "ER" and "A") is reduced. In addition to simply reducing the frequency of such errors (due to fewer cells being programmed to problematic states), in some instances, the voltage range under the statistical curves of each state may shrink as the population of that curve shrinks, since programming cells to the state is less likely to result in voltages toward the extremes of the range. Thus, in some such instances, voltage ranges of otherwise error-prone states can be rendered non-overlapping, rendering the states non-error-prone.

One example distribution after application of data shaping is shown as distribution 306. Specifically, distribution 306 can represent state curves within a block 128 after application of data shaping that alters the probability of a given page being written with a specific bit value. In the example of distribution 306, the probability of lower page bit values remains evenly distributed, while the probability of middle page bit values has been set at a 25% probability of a 1 value and a 75% probability of a 0 value, and the probability of upper page bit values has been set at a 10% probability of a 1 value and a 90% probability of a 0 value. These probabilities may be set, for example, in accordance with the teachings of the Data Shaping References incorporated by reference above. Thus, the population of cells with upper or middle page bit values of 1 is reduced, reducing the height of curves corresponding to states "ER" and "A". Conversely, the height of curve for state "C," for example, is increased, reflecting an increased likelihood of data with the upper or middle page bit values of 0. Due to the reduction in curves for states "ER" and "A", the total voltage ranges for those states is also reduced. Thus, the overlap between those states can be reduced or eliminated, as shown at line 310. In one embodiment, a controller 122 may utilize the voltage represented by line 310 as a read voltage threshold for the block 128, to distinguish between states "ER" and "A". Thus, errors when reading data from a block can be reduced in the distribution 306 relative to distribution 304.

While the distributions 304 and 306 reflect a particular configuration of state curves that result in error-prone states, other configurations are also possible. Any two or more state curves of a block may intersect, creating error-prone states. Illustratively, it can be relatively common for curves of two highest voltage states to interest, rendering states "F" and "G", for example, error-prone. Moreover, while distributions 302-306 reflect a specific number of states (e.g., for 3-bit per cell MLC memory), the number of states may vary according to memory configuration.

While the data shaping above is discussed with reference to modifying probabilities of bit values within specific pages, other data shaping techniques are contemplated. For example, one data shaping technique (e.g., as taught in the '559 Patent) may enable the controller 124 to change probabilities of each state, rather than of each bit value of a page. Thus, for example, use of these techniques may enable the controller 124 to directly reduce the probability of data being stored in the "ER" or "A" states.

In some instances, data shaping to modify state probabilities may be applied only to blocks with detected error rates above a threshold amount (e.g., "bad" blocks). In other instances, data shaping to modify state probabilities may be applied to both "bad" blocks and otherwise healthy blocks. For example, data shaping may be applied to healthy blocks in order to reduce the likelihood of cells developing error-prone states, by reducing frequency of use of states that tend to become error-prone. Illustratively, data shaping may be used to adjust state probabilities in a healthy block according to the following table:

TABLE 1

|  | ER | A | B | C | D | E | F | G |
|---|---|---|---|---|---|---|---|---|
| BOL | 0.125 | 0.125 | 0.125 | 0.125 | 0.125 | 0.125 | 0.125 | 0.125 |
| MOL | 0.1 | 0.1 | 0.133 | 0.133 | 0.133 | 0.133 | 0.133 | 0.133 |
| EOL | 0.05 | 0.05 | 0.15 | 0.15 | 0.15 | 0.15 | 0.15 | 0.15 | where ER-G represent states of a cell, "BOL" indicates beginning-of-life of a device, "MOL" indicates middle-of-life, "EOL" indicates end-of-life (according to any life metric, such as number of read/write cycles, hours of use, etc.), and the numbers provided indicate a statistical distribution between stares at each time during life. Various other factors may be used to establish data shaping. For example, the specific shaping may vary based on a temperature of the device.

Using Data Shaping Techniques to Address Error-Prone States

Figure 4:
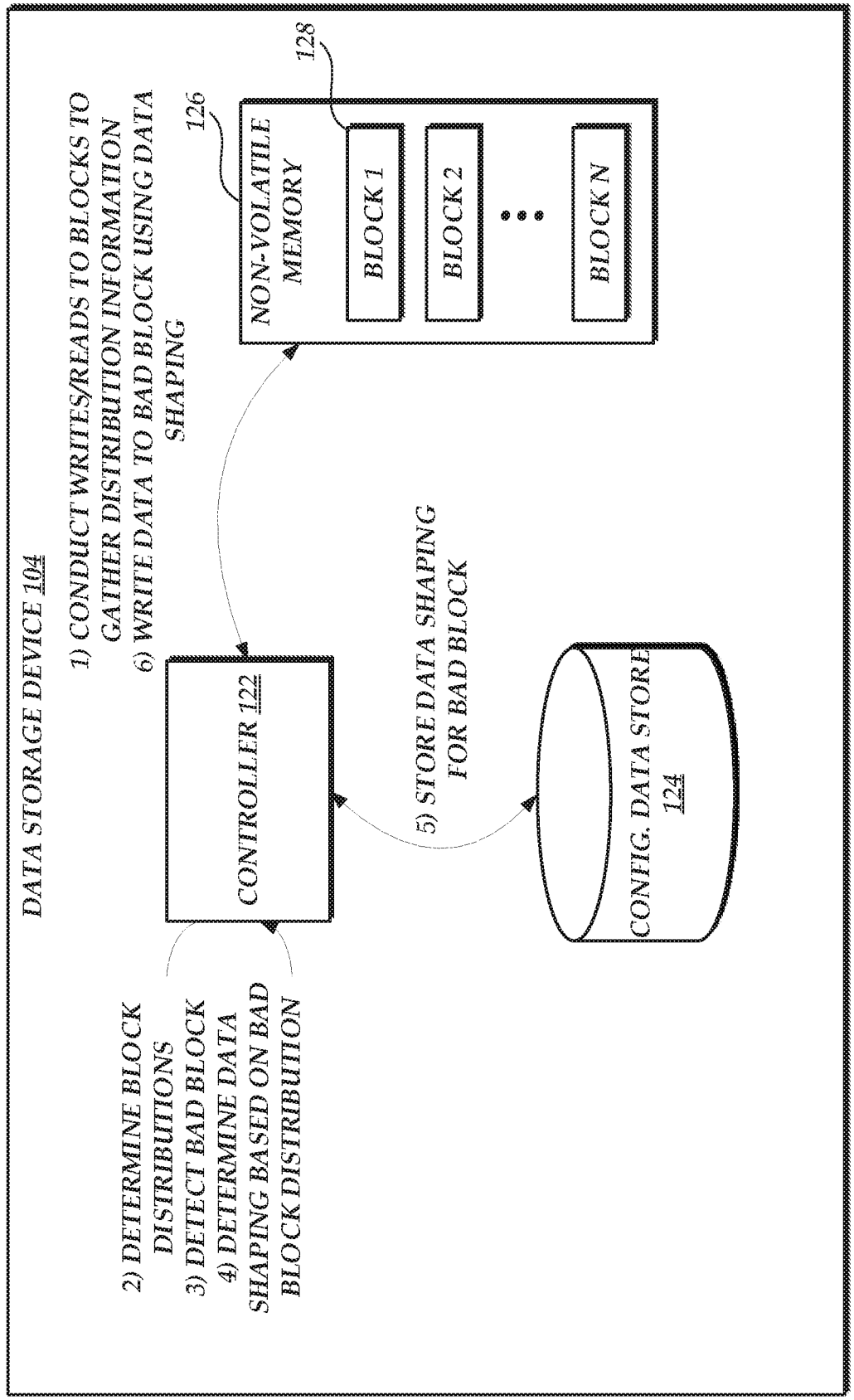
FIG. 4 is flow-diagram illustrating operation of a data storage device of FIG. 1 to apply data shaping to data written within a data block based on a determined voltage distribution of the block, resulting in error rate reduction within the block.

Illustrative interactions for applying data shaping techniques to address detection of blocks 128 including cells with error-prone states are shown in FIG. 4. The interactions may be carried out, for example, during production of the device 104 or during use of the device (e.g., periodically during life of the device 104)

The interactions begin at (1), where a controller 122 conducts reads and/or writes to blocks 128 of the non-volatile memory 126 to gather information regarding errors rates on such reads and writes. Thereafter, at (2), the controller 122 can utilize the gathered information to determine state distributions on, e.g., a per-block basis. The distributions may be similar to those illustrated in FIG. 3, above.

At (3), the controller 122 can detect one or more "bad" blocks within the memory 126. Such "bad" blocks may include, for example, blocks 128 with cells having error-prone states, or blocks 128 that have otherwise been identified as error prone (e.g., having an error rate exceeding or coming near to the ability of the device 104 to correct).

At (4), the controller 122 can determine data shaping to be applied to the bad blocks based on voltage distributions, as determined, e.g., at interaction (2). Illustratively, where a bad block has a distribution indicating that low voltage states are error-prone, the controller 122 may determine a data shaping shifting data into high voltage states. In one embodiment, the controller 122 is pre-programming with a variety of specific data shaping algorithms, each of which results in a different distribution. The controller 122 may therefore select an algorithm that results in a distribution minimizing writes to error-prone states. In another embodiment, the controller 122 is configured to dynamically determine the specific data shaping to be applied. For example, the controller 122 may be configured to reduce a percentage of data written into an error-prone state proportional to the propensity of the state to result in read errors (e.g., based on the size of overlap with another state). In yet another embodiment, the controller 122 may be configured to determine a data shaping algorithm to be applied to a block 128 based on other characteristics of the block 128 (such as time-to-write to the block, etc.). In some such embodiments, the controller 122 may not be required, for example, to determine an actual voltage distribution for the block 128.

At (5), the controller 122 stores information relating to the specific data shaping algorithm determined for the block 128 within the configuration data store 124. In accordance with the teachings of the Data Shaping References, incorporated by reference above, this information may be utilized, for example, when reading data from the block 128, in order to transfer the shaped data into the originally written data.

In addition, at (6) the controller 122 writes data (e.g., from a host device 102) to the block 128 by application of the data shaping to the data. Thus, the data can be shaped to reduce the likelihood that writing the data to the block 128 utilizes error-prone states of the block 128, improving operation of the device 104.

Routine for Applying Data Shaping to Recover Error-Prone Blocks

Figure 5:
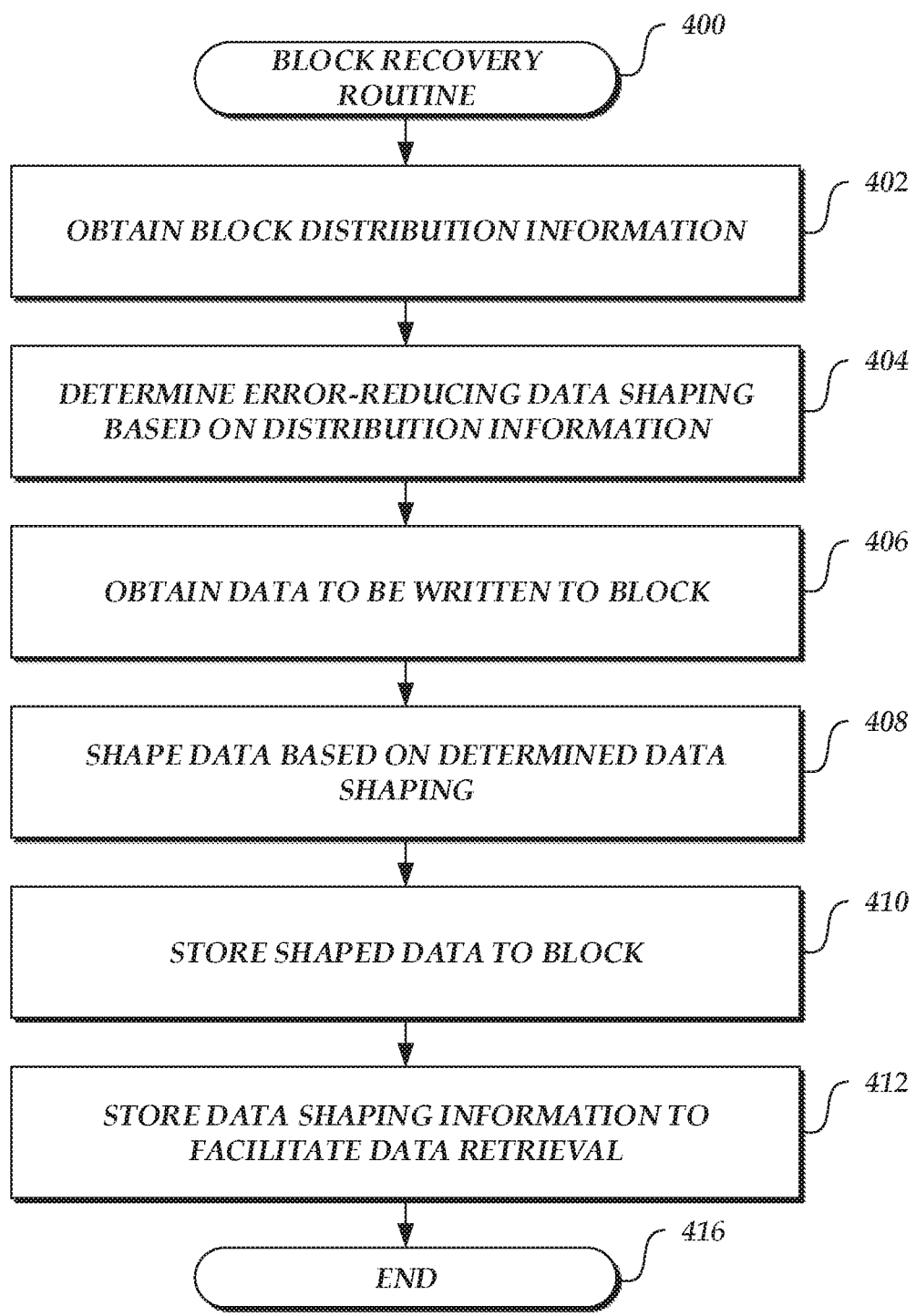
FIG. 5 is an illustrative routine for recovering an error-prone block within a data storage device based on application of data shaping determined from a voltage distribution of the block.

FIG. 5 is a flow diagram illustrating a routine 500 for applying data shaping techniques on a device 104 to address an occurrence of error-prone states within a block 128 of memory 126. The routine 500 may be implemented, for example, by a controller 122. Illustratively, the routine 500 may be utilized to recover blocks 128 otherwise not usable by the device 104 due to a likelihood of errors. The routine 500 may therefore be implemented, for example, in response to detecting an error rate of a block 128 has exceeded a threshold level.

The routine 500 begins at element 502, where the controller obtains block distribution information for the block 128 (e.g., reflecting a distribution of voltages among a population of data written to the block 128(. In one embodiment, the distribution information is determined directly by the controller 122. For example, the controller 122 may perform a series of read/write operations on the block 128 to determine the distribution. In another embodiment, the distribution information may be determined based on characteristics of the block 128, as well as a mapping of those characteristics to an expected distribution of the block 128 (which mapping information may be determined, for example, based on application of a machine learning algorithm to the characteristics of the block).

At element 504, the controller 122 determines a data shaping to be applied to the block 128 based on the distribution information, in order to reduce errors on the blocks due to programming of cells into error-prone states. In one embodiment, the controller 122 is pre-programming with a variety of specific data shaping algorithms, each of which results in a different distribution. The controller 122 may therefore select an algorithm that results in a distribution minimizing writes to error-prone states. In another embodiment, the controller 122 is configured to dynamically determine the specific data shaping to be applied. For example, the controller 122 may be configured to reduce a percentage of data written into an error-prone state proportional to the propensity of the state to result in read errors (e.g., based on the size of overlap with another state).

At element 506, the controller 122 receives data to be written to the block 128, such as data provided by a host device 102. The controller 122 then applies the determined data shaping to the data, to result in shaped data. As discussed above, the shaped data may be modified from the original data, such that the likelihood of use of an error-prone state is reduced. For example, where the error-prone states include a state representing the "111" bit pattern, the shaped data may reduce the occurrence of this bit pattern relative to the original data.

At element 510, the shaped data is written to the block 128. The data shaping information is additionally stored, at element 512, to facilitate later reading of the data from the block (e.g., such that the shaped data can be returned to its original state by inversion of the data shaping previously applied). The routine 500 can then end at block 516. Because the shaped data is less likely to include patterns requiring storage in error-prone states, the overall error rate when reading back data from the block 128 can be reduced.

While illustrative interactions are described above with respect to FIG. 5, in some embodiments the routine 400 may include additional or alternative interactions. For example, where distributions are predicted based on block-level characteristics (e.g., rather than directly measured by a controller 122), the controller 122 may be configured with a set of data shaping algorithms to be applied to a given set of block-level characteristics, according to a distribution predicted for such characteristics. In some such instances, the controller 122 itself might not have any knowledge of the distribution of a given block 128, and may therefore not determine such a distribution. In instances where distributions are inferred or predicted based on block-level characteristics, the routine 500 may in some instances be implemented by a controller 122 without requiring reads from or writes to non-volatile memory 126. This lack of interaction with the memory 126 may be beneficial, for example, in reducing wear on the memory 126, or in enabling rapid execution of the routine 400 on the controller 122. However, in some embodiments, the routine 500 may be modified to include additional or alternative interactions with the memory 126. For example, the controller 122 in some instances may be configured to test a new data shaping technique (e.g., as determined at element 504) with respect to blocks 128 to which the data shaping technique will be applied. For example, the controller 122 may attempt to determine a bit error rate (BER) resulting from application of the new data shaping technique to the blocks 128, and may assign the new data shaping technique only to blocks 128 meeting threshold error rate criteria. The controller 122 may then attempt to reevaluate data shaping techniques for any blocks 128 not meeting the criteria. Thus, the interactions of FIG. 5 are intended to be illustrative in nature.

Conclusion

As discussed above, the present disclosure enables a reduction in error rates on flash memory devices, by enabling the selection and application of data shaping techniques to data in order to reduce use of error-prone states within cells or groups of cells on such devices. This can enable a flash memory device to more accurately store information, and in some cases may extend the life of such a device or render devices usable that would otherwise be deemed unfit for use. Embodiments of the present disclosure overcome limitations inherent within devices that experience error-prone states within cells, by enabling use of such cells and reducing error rates based on such use. Thus, embodiments described herein can enable significant improvement in the operation of flash memory devices.

Other Variations

Those skilled in the art will appreciate that in some embodiments, additional or alternative modules can be used to perform functionalities described herein. The actual steps taken in the disclosed processes, such as the routines illustrated in FIG. 5, may differ from those shown in the figures. Additional system components can be utilized, and disclosed system components can be combined or omitted. Depending on the embodiment, certain of the steps described above may be removed, others may be added.

While certain embodiments have been described, these embodiments have been presented by way of example only, and are not intended to limit the scope of the protection.

Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to flash memory as included in any number of devices, such as removable flash cards, embedded memory, SSDs, hybrid hard drives, and the like. Moreover, while embodiments are described herein as implemented by a controller of a flash memory device, these functionalities may additionally or alternatively be implemented on systems external to a flash memory device. Illustratively, the machine learning algorithms described with respect to FIGS. 5 and 6 of U.S. patent application Ser. No. 15/640,225, entitled "Identifying Memory Block Write Endurance using Machine Learning" and filed Jun. 30, 2017 (the "'225 Application") may be implemented in a modified form on a network-connected system external to a flash memory device, which operates to collect information from any number of devices, such as characteristics and corresponding voltage distribution information, and to determine correlations between such characteristics of memory cells and distributions of such cells. Such system may then transmit learned correlation information or determined data shaping techniques responsive to a predicted distribution to a flash memory device for use by a controller in the manner described above.

The various components illustrated in the figures may be implemented as software and/or firmware on a processor, ASIC/FPGA, or dedicated hardware. Hardware components, such as processors, ASICs, FPGAs, and the like, can have logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

While the description herein refers to flash or NAND memory, it is understood that the various disclosed embodiments are applicable to various types of non-volatile solid-state memory which may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete Non-Volatile Memory (NVM) chips, or any combination thereof.

What is claimed is:

1. A memory device comprising:
    a non-volatile memory comprising non-volatile solid-state memory cells, the cells arranged into a plurality of blocks; and
    a controller comprising a processor and configured to:
        prior to determining a data shaping to be applied to input data:
            obtain, for a first block of the plurality of blocks, information reflective of measured characteristics of the first block by performing write and read operations to the first block, wherein the measured characteristics vary among the plurality of blocks, the information identifying an expected voltage range for each state of a plurality of states in which non-volatile solid-state memory cells of the first block may be placed; and
            identify a state, of the plurality of states, whose expected voltage range overlaps with the expected voltage range of another state of the plurality of states, wherein the state is representative of a data value;
        determine, based at least partly on the state, the data shaping to be applied to the input data intended to be written to the first block, wherein the data shaping transforms the input data into an output data while reducing a probability of the data value occurring within the output data relative to a probability of the data value occurring within the input data;
        receive the input data;
        apply the data shaping to the input data to transform the input data into the output data; and
        write the output data to the block, wherein the input data, if written to the first block, would result in the non-volatile solid-state memory cells of the first block being placed in a uniform distribution of the plurality of states, and wherein the output data, when written to the block, results in the non-volatile solid-state memory cells of the first block being placed in a non-uniform distribution of the plurality of states.

2. The memory device of claim 1, wherein the non-volatile memory includes at least one of single-level cell (SLC) memory, 2-bits per cell multi-level cell (MLC) memory, 3-bits per cell MLC memory, of 4-bits per cell MLC memory.

3. The memory device of claim 1, wherein the controller is further configured to:
    receive a request to read the first block;
    read the output data from the first block;
    apply an inversion of the data shaping to the output data to transform the output data into the input data; and
    respond to the request by providing the input data.

4. The memory device of claim 1, wherein the controller is configured to obtain the information identifying the expected voltage range for each state of the plurality of states in which the first block may be placed based at least partly on conducting read/write operations on the first block.

5. The memory device of claim 1, wherein the information identifying the expected voltage range for each state of the plurality of states in which the first block may be placed is represented as a voltage distribution for the first block, and wherein the controller is configured to obtain the voltage distribution for the first block based at least partly on comparing characteristics of the first block to information mapping the characteristics to the voltage distribution.

6. The memory device of claim 1, wherein the controller is configured to identify the first block based at least partly on detecting that an error rate of the first block meets a threshold rate.

7. The memory device of claim 1, wherein the non-volatile memory stores a plurality of data shapings each associated with a reduction in use of a corresponding state, and wherein the controller is configured to determine the data shaping to be applied to the input data at least partly by selecting the data shaping from the plurality of data shapings according to the identified state.

8. The memory device of claim 1, wherein the non-volatile memory stores a data shaping algorithm associated with parameters, and wherein the controller is configured to determine the data shaping by setting the parameters of the data shaping algorithm.

9. The memory device of claim 8, wherein the parameters of the data shaping algorithm include a probability of one or more bit values within the data value occurring within the output data.

10. The memory device of claim 8, wherein the parameters of the data shaping algorithm include relative preference for the data value within the output data relative to other potential data values.

11. The memory device of claim 8, wherein the controller is configured to set the parameters of the data shaping algorithm based at least partly on an overlap between the expected voltage range of the identified state with the expected voltage range of the other state.

12. The memory device of claim 1, wherein the state represents a lowest voltage range state relative to other states of the plurality of states.

13. The memory device of claim 1, wherein the state represents a highest voltage range state relative to other states of the plurality of states.

14. A method implemented on a memory device, the method comprising:
   prior to applying a data shaping to input data:
      obtaining, for a group of cells on the memory device, information reflective of measured characteristics of the group of cells by performing write and read operations to the group of cells, wherein the measured characteristics vary among groups of cells on the memory device, the information identifying expected voltage ranges for at least two states in which individual cells within the group of cells may be placed; and
      identifying a state, of the at least two states, whose expected voltage range overlaps with the expected voltage range of another state of the at least two states, wherein the state is representative of a data value;
   obtaining the input data to be written to the group of cells;
   applying the data shaping to the input data to generate output data, wherein the data shaping is selected at least partly based on the identified state, and wherein the data shaping transforms the input data into the output data while reducing a probability of the data value occurring within the output data relative to a probability of the data value occurring within the input data; and
   storing the output data within the group of cells.

15. The method of claim 14, wherein obtaining the information identifying the expected voltage ranges for the at least two states in which the group of cells may be placed comprises conducting read/write operations on the group of cells.

16. The method of claim 14, wherein the information identifying the expected voltage ranges for the at least two states in which the group of cells may be placed is represented as a voltage distribution for the group of cells, and wherein obtaining the voltage distribution for the group of cells comprises comparing characteristics of the group of cells to information mapping the characteristics to the voltage distribution.

17. The method of claim 14 further comprising identifying the group of cells based at least partly on detecting that an error rate of the group of cells meets a threshold rate.

18. The method of claim 14, wherein the data shaping is selected from a plurality of data shapings based at least partly on the identified state.

19. The method of claim 14, wherein the data shaping is selected at least partly by setting parameters of a data shaping algorithm according to the identified state.

20. The method of claim 14, wherein the input data, if written to the group of cells, results in the group of cells being placed in a uniform distribution between the at least two states, and wherein the output data, when written to the group of cells, results in the group of cells being placed in a non-uniform distribution between the at least two states.

21. The method of claim 14, wherein the state represents a lowest voltage range state relative to other states of the at least two states.

22. The method of claim 19, wherein the parameters of the data shaping algorithm are further set according to an overlap between the expected voltage range of the identified state with the expected voltage range of the other state.

23. A memory device comprising:
   a non-volatile memory; and
   a controller comprising a processor and configured to:
      prior to applying a data shaping to input data:
         obtain, for a group of cells of the non-volatile memory, information reflective of measured characteristics of the group of cells by performing write and read operations to the group of cells, wherein the measured characteristics vary among groups of cells on the memory, the information identifying expected voltage ranges for at least two states in which the group of cells may be placed; and
         identify a state, of the at least two states, whose expected voltage range overlaps with the expected voltage range of another state of the at least two states, wherein the state is representative of a data value;
      obtain the input data to be written to the group of cells;
      apply the data shaping to the input data to generate output data, wherein the data shaping is selected at least partly based on the identified state, and wherein the data shaping transforms the input data into the output data while reducing a probability of the data value occurring within the output data relative to a probability of the data value occurring within the input data; and
      store the output data within the group of cells.

24. A memory device, comprising:
   means for storing a plurality of blocks of data; and
   controller means coupled to the means for storing, wherein the controller means is configured to:
      receive input data;
      prior to determining a data shaping to be applied to the input data:
         obtain, for a first block of the plurality of blocks, information reflective of measured characteristics of the first block by performing write and read operations to the first block, wherein the measured characteristics vary among the plurality of blocks, the information identifying an expected voltage range for each state of a plurality of states in which non-volatile solid-state memory cells of the first block are placed; and identify a state, of the plurality of states, whose expected voltage range overlaps with the expected voltage range of another state of the plurality of states, wherein the state is representative of a data value;

determine, based at least partly on the state, the data shaping to be applied to the input data intended to be written to the first block, wherein the data shaping transforms the input data into output data while reducing a probability of the data value occurring within the output data relative to a probability of the data value occurring within the input data;

apply the data shaping to the input data to transform the input data into the output data; and write the output data to the block, wherein the input data, if written to the first block, results in the non-volatile solid-state memory cells of the first block being placed in a uniform distribution of the plurality of states, and wherein the output data, when written to the block, results in the non-volatile solid-state memory cells of the first block being placed in a non-uniform distribution of the plurality of states.

* * * * *